US009666780B2

(12) United States Patent
Tsai et al.

(10) Patent No.: US 9,666,780 B2
(45) Date of Patent: May 30, 2017

(54) LIGHT-EMITTING DEVICE AND MANUFACTURING METHOD THEREOF

(71) Applicant: EPISTAR CORPORATION, Hsinchu (TW)

(72) Inventors: Fu Chun Tsai, Hsinchu (TW); Wen Luh Liao, Hsinchu (TW); Shih I Chen, Hsinchu (TW); Chia Liang Hsu, Hsinchu (TW); Chih Chiang Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/078,355

(22) Filed: Mar. 23, 2016

(65) Prior Publication Data

US 2016/0204322 A1 Jul. 14, 2016

Related U.S. Application Data

(62) Division of application No. 14/556,032, filed on Nov. 28, 2014, now Pat. No. 9,331,249.

(30) Foreign Application Priority Data

Nov. 28, 2013 (TW) .............................. 102143141 A

(51) Int. Cl.
| | |
|---|---|
| *H01L 33/62* | (2010.01) |
| *H01L 33/40* | (2010.01) |
| *H01L 33/46* | (2010.01) |
| *H01L 33/42* | (2010.01) |

(Continued)

(52) U.S. Cl.
CPC ............ *H01L 33/62* (2013.01); *H01L 33/405* (2013.01); *H01L 33/46* (2013.01); *H01L 33/0079* (2013.01); *H01L 33/22* (2013.01); *H01L 33/42* (2013.01); *H01L 2933/0016* (2013.01)

(58) Field of Classification Search
CPC ....... H01L 33/405; H01L 33/42; H01L 33/46; H01L 33/60; H01L 33/62
See application file for complete search history.

(56) References Cited

U.S. PATENT DOCUMENTS

| 8,143,636 B2 * | 3/2012 | Lin .......................... H01L 33/42 |
| | | 257/100 |
| 8,637,888 B2 | 1/2014 | Hodota et al. |
| 9,443,903 B2 * | 9/2016 | Bergmann ............... H01L 24/29 |

(Continued)

*Primary Examiner* — Allan R Wilson
(74) *Attorney, Agent, or Firm* — Muncy, Geissler, Olds & Lowe, P.C.

(57) ABSTRACT

The present disclosure provides a light-emitting device and manufacturing method thereof. The light-emitting device comprises: a metal connecting structure; a barrier layer on the metal connecting structure, the barrier layer comprising a first metal multilayer on the metal connecting structure and a second metal multilayer on the first metal multilayer; a metal reflective layer on the barrier layer; and a light-emitting stack electrically coupled to the metal reflective layer, wherein the first metal multilayer comprises a first metal layer comprising a first metal material and a second metal layer comprising a second metal material, and the second metal multilayer comprises a third metal layer comprising a third metal material and a fourth metal layer comprising a fourth metal material.

20 Claims, 7 Drawing Sheets

(51) Int. Cl.
    *H01L 33/00*        (2010.01)
    *H01L 33/22*        (2010.01)

(56)            References Cited

U.S. PATENT DOCUMENTS

| | | |
|---|---|---|
| 2004/0135166 A1 | 7/2004 | Yamada et al. |
| 2005/0168992 A1 | 8/2005 | Hirose |
| 2006/0081869 A1 | 4/2006 | Lu et al. |
| 2008/0116472 A1 | 5/2008 | Tsunoda |
| 2008/0157109 A1 | 7/2008 | Hon |
| 2010/0123153 A1* | 5/2010 | Lin ................... H01L 33/46 257/98 |
| 2012/0119243 A1 | 5/2012 | Kim et al. |
| 2012/0235204 A1 | 9/2012 | Hodota et al. |
| 2013/0069095 A1 | 3/2013 | Hodota |
| 2013/0153920 A1 | 6/2013 | Sugawara |
| 2013/0307002 A1 | 11/2013 | Ko et al. |
| 2014/0134765 A1 | 5/2014 | Chen |
| 2015/0060923 A1 | 3/2015 | Park |
| 2015/0214424 A1 | 7/2015 | Fudeta |

* cited by examiner

LIGHT-EMITTING DEVICE AND MANUFACTURING METHOD THEREOF

CROSS REFERENCE TO RELATED APPLICATIONS

This application is a Divisional of co-pending patent application Ser. No. 14/556,032, filed on Nov. 28, 2014, for which priority is claimed under 35 U.S.C. §120; and this application claims priority of Application No. 102143141 filed in Taiwan, R.O.C. on Nov. 28, 2013; the contents of all of which are hereby incorporated by reference in their entirety.

FIELD OF DISCLOSURE

The present disclosure relates to a light-emitting device and manufacturing method thereof, in particular to a light-emitting device having a barrier layer comprising a metal multilayer and manufacturing method thereof.

BACKGROUND OF THE DISCLOSURE

FIG. 1 shows a structure of a conventional light-emitting diode. The light-emitting diode comprises a permanent substrate 109, a light-emitting stack 102, a metal reflective layer 106, a barrier layer 107, and a metal connecting structure 108 disposed on the permanent substrate 109. In addition, a first electrode 110E1 and an extending electrode 110E1' are disposed on the light-emitting stack 102, and a second electrode 110E2 is disposed on the permanent substrate 109 for current conduction.

The metal reflective layer 106 is for reflecting light emitted by the light-emitting stack 102. The metal connecting structure 108 is for connecting the permanent substrate 109 and the barrier layer 107 by connecting two layers of materials to form an alloy. The barrier layer 107 is disposed between the metal reflective layer 106 and the metal connecting structure 108 to prevent metal diffusion between the metal reflective layer 106 and the metal connecting structure 108. However, the formation of the metal connecting structure 108 is generally performed at a high temperature, for example, a temperature higher than 300° C., and the composition of the metal connecting structure 108 are usually different from composition of the metal reflective layer 106. In other words, composition of the metal connecting structure 108 and composition of the metal reflective layer 106 do not comprise the same metal element. For example, silver (Ag) is used for the conventional metal reflective layer 106, and an alloy with zinc (Zn) as the main component, such as an alloy of zinc (Zn) and aluminum (Al), is used for the metal connecting structure 108 to facilitate a high-temperature bonding. When the metal reflective layer 106 and the metal connecting structure 108 do not comprise the same metal element, a thin barrier layer (less than 100 nm) for the conventional barrier layer 107 is able to prevent metal diffusion between the metal reflective layer 106 and the metal connecting structure 108.

However, with the development of applications of the light-emitting diode, the requirement for performance is gradually increased. For example, when a light-emitting diode is used in the automotive field, for the safety concern, requirement for the reliability for a light-emitting diode used in the automotive field is higher than that for a light-emitting diode used in the display field. Therefore, a material with better stability is required for the metal reflective layer. In addition, compared with silver which tends to have electro-migration, using other metal material as the metal reflective layer 106 has advantages. Furthermore, the low-temperature bonding of the metal connecting structure 108 becomes a trend, the material selection of the metal connecting structure 108 needs to be diversified. When the metal reflective layer 106 and the metal connecting structure 108 comprise the same metal element, because there is same metal element existing on both sides of the barrier layer 107, other elements in the alloy of the metal connecting structure 108 are particularly easy to be combined with the same metal element on both sides of the barrier layer 107. Accordingly, the design of thin barrier layer is unable to effectively prevent metal diffusion between the metal reflective layer 106 and the metal connecting structure 108. After the high-temperature processing steps in the manufacturing processes, the metal element in the metal connecting structure 108 tends to diffuse to the metal reflective layer 106 to cause a decrease in reflectivity of the metal reflective layer 106, and the luminous intensity of the light-emitting diode is decreased.

SUMMARY OF THE DISCLOSURE

The present disclosure provides a light-emitting device and manufacturing method thereof. The light-emitting device comprises: a metal connecting structure; a barrier layer on the metal connecting structure, the barrier layer comprising a first metal multilayer on the metal connecting structure and a second metal multilayer on the first metal multilayer; a metal reflective layer on the barrier layer; and a light-emitting stack electrically coupled to the metal reflective layer, wherein the first metal multilayer comprises a first metal layer comprising a first metal material and a second metal layer comprising a second metal material, the first metal layer closer to the metal connecting structure than the second metal layer, and the second metal multilayer comprises a third metal layer comprising a third metal material and a fourth metal layer comprising a fourth metal material, the third metal layer closer to the second metal layer than the fourth metal layer, and the first metal material is different from the second metal material, and the third metal material is different from the fourth metal material.

Furthermore, the present disclosure provides a light-emitting device comprising: a metal connecting structure; a barrier layer on the metal connecting structure, the barrier layer comprising a first metal multilayer on the metal connecting structure and a second metal multilayer on the first metal multilayer; a metal reflective layer on the barrier layer; and a light-emitting stack electrically coupled to the metal reflective layer, wherein the metal connecting structure and the metal reflective layer comprise the same metal element, and the barrier layer comprises metal elements different from a metal element in the metal reflective layer.

DETAILED DESCRIPTION OF THE DISCLOSURE

Figure 1:
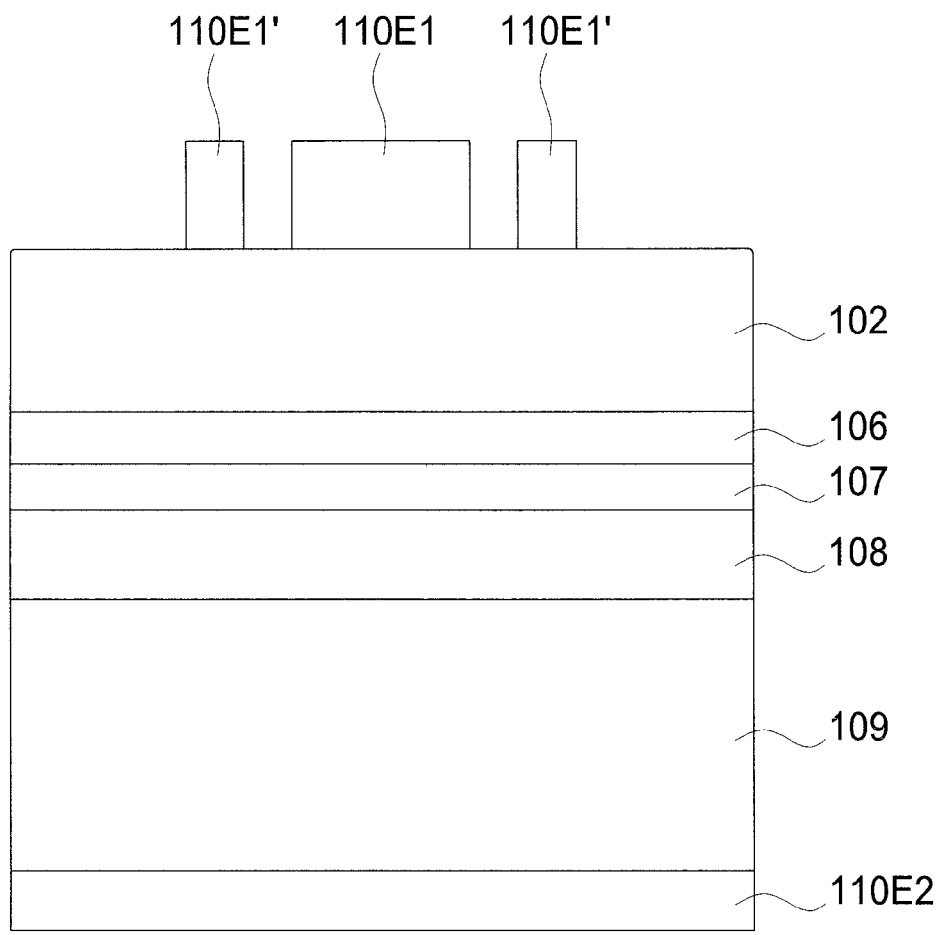
FIG. 1 shows a structure of a conventional light-emitting diode.

FIG. 2 shows a light-emitting device and manufacturing method thereof in accordance with a first embodiment of the present disclosure. As shown in FIG. 2A, the method for forming the light-emitting device comprises providing a growth substrate 201 and forming a light-emitting stack 202 on the growth substrate 201. The light-emitting stack 202 comprises a semiconductor stack which comprises from the bottom to the top a first conductive type semiconductor layer 202a, a light-emitting layer 202b on the first conductive type semiconductor layer 202a, and a second conductive type semiconductor layer 202c on the light-emitting layer 202b. The first conductive type semiconductor layer 202a and the second conductive type semiconductor layer 202c are of different conductive types. For example, the first conductive type semiconductor layer 202a is an n-type semiconductor layer, and the second conductive type semiconductor layer 202c is a p-type semiconductor layer. The first conductive type semiconductor layer 202a, the light-emitting layer 202b, and the second conductive type semiconductor layer 202c comprise III-V group material, such as AlGaInP series materials.

Figure 2A:
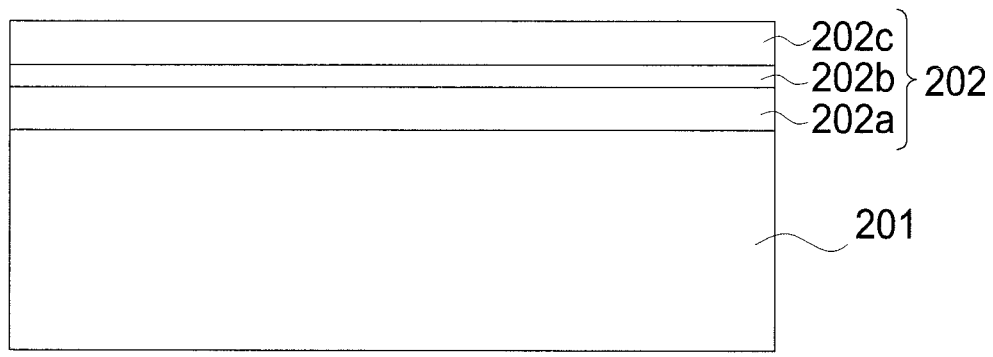
FIGS. 2A to 2I show a light-emitting device and manufacturing method thereof in accordance with a first embodiment of the present disclosure.
Figure 2B:
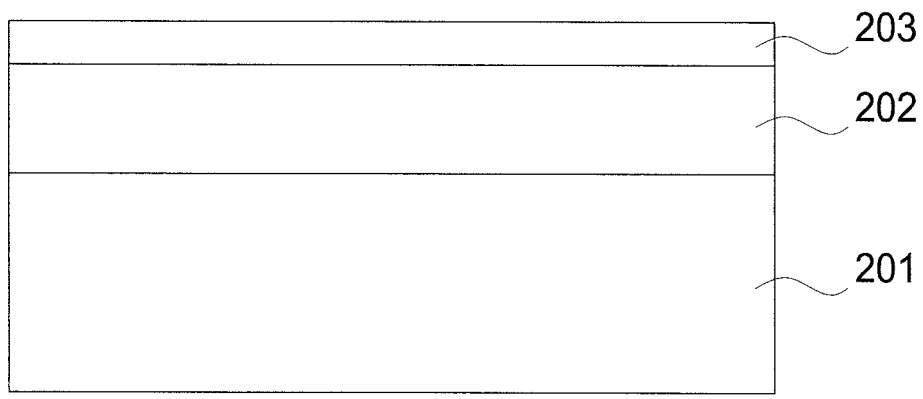
Figure 2C:
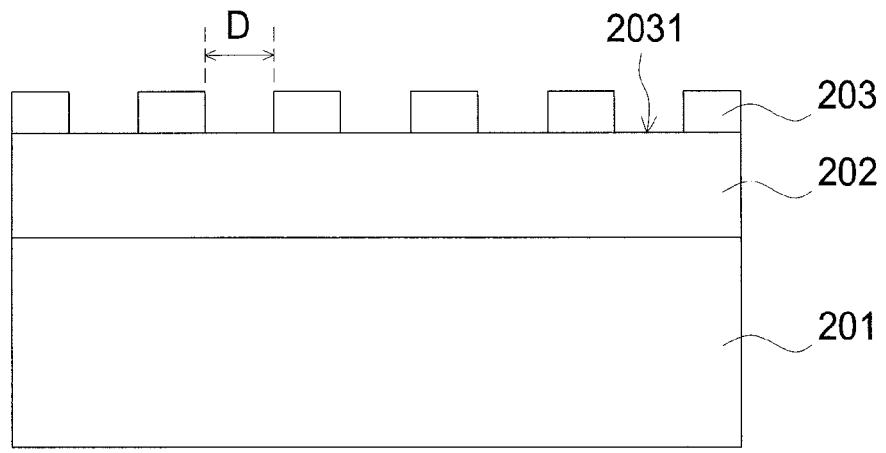

Next, as shown in FIG. 2B, the method further comprises forming a dielectric layer 203 on the light-emitting stack 202. The dielectric layer 203 has a refractive index smaller than the refractive index of the light-emitting stack 202. For example, the dielectric layer 203 can be silicon oxide ($SiO_x$), magnesium fluoride ($MgF_2$), and silicon nitride ($SiN_x$). A thickness of the dielectric layer 203 is from about 50 nm to 150 nm, and the thickness of the dielectric layer 203 is 100 nm in the present embodiment. Next, as shown in FIG. 2C, the method further comprises forming a plurality of through holes 2031 in the dielectric layer 203 by lithography and etching processes. The through holes 2031 penetrate the dielectric layer 203. From the top view, the through holes 2031 are substantially circles (not shown) with a diameter D of from about 5 μm to 15 μm. The diameter D is about 10 μm in the present embodiment.

Figure 2D:
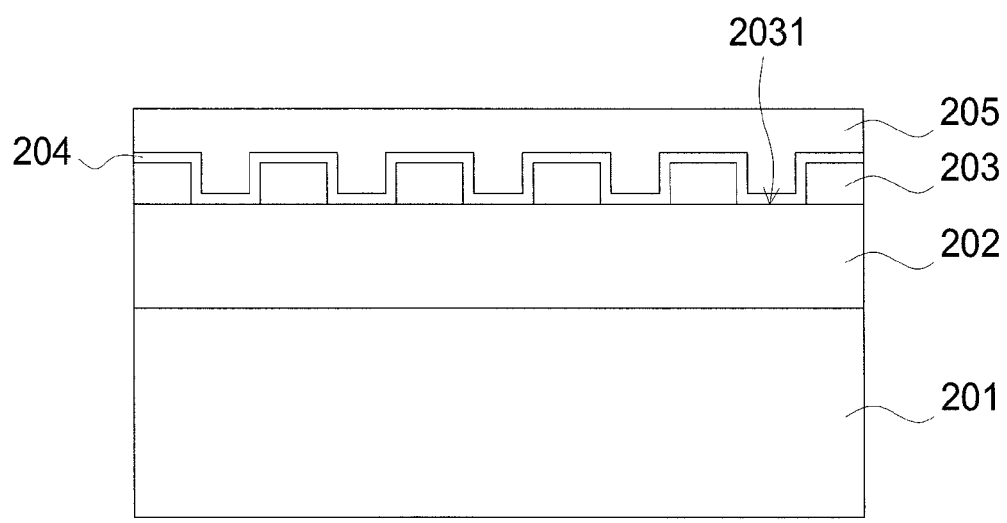

Next, as shown in FIG. 2D, the method further comprises forming a first transparent conductive oxide layer 204 on the dielectric layer 203 and filling into the through holes 2031 so the first transparent conductive oxide layer 204 and the light-emitting stack 202 form an ohmic contact. A thickness of the first transparent conductive oxide layer 204 is from about 25 Å to 100 Å. The thickness of the first transparent conductive oxide layer 204 is about 75 Å in the present embodiment. Then a second transparent conductive oxide layer 205 is formed on the first transparent conductive oxide layer 204, wherein the second transparent conductive oxide layer 205 is for providing a current diffusion in a lateral direction (a direction perpendicular to the stacking direction of the layers) and comprises a material different from that of the first transparent conductive oxide layer 204. A thickness of the second transparent conductive oxide layer 205 is from about 0.5 μm to 3 μm, and the thickness of the second transparent conductive oxide layer 205 is 1.0 μm in the present embodiment. It is noted that the second transparent conductive oxide layer 205 is much thicker than the first transparent conductive oxide layer 204 and the dielectric layer 203, so as shown in the figure, after the formation of the second transparent conductive oxide layer 205, the through holes 2031 are filled up, and the uneven surface caused by the height difference from the through holes 2031 becomes a more even surface. The first transparent conductive oxide layer 204 and the second transparent conductive oxide layer 205 comprise a material such as indium tin oxide (ITO), aluminum zinc oxide (AZO), cadmium tin oxide, antimony tin oxide, zinc oxide (ZnO), zinc tin oxide, and indium zinc oxide (IZO). In the present embodiment, the first transparent conductive oxide layer 204 comprises indium tin oxide (ITO), and the second transparent conductive oxide layer 205 comprises indium zinc oxide (IZO).

Figure 2E:
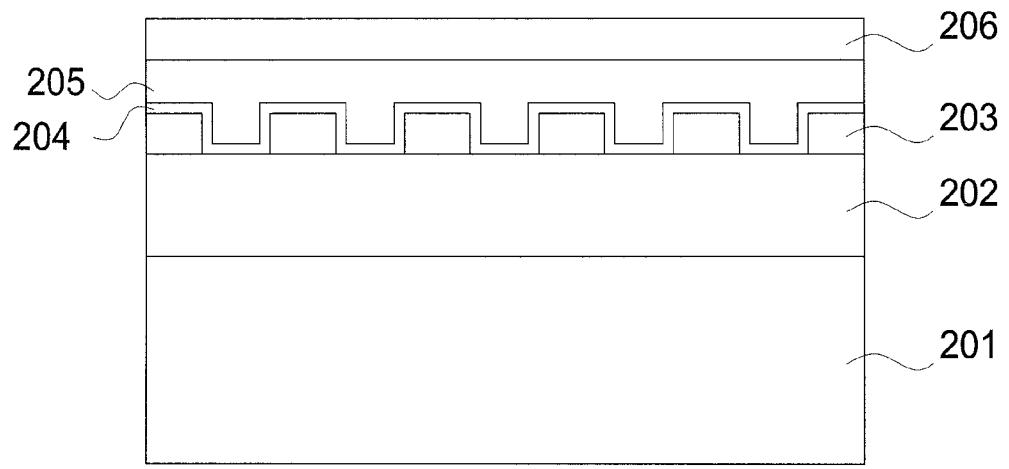

Next, as shown in FIG. 2E, the method further comprises forming a metal reflective layer 206 on the second transparent conductive oxide layer 205, wherein the metal reflective layer 206 comprises a metal material for reflecting light emitted by the light-emitting stack 202. In the present embodiment, the metal reflective layer 206 has a reflectivity greater than 90% to light emitted by the light-emitting stack 202. For example, the metal reflective layer 206 comprises gold (Au).

Figure 2F:
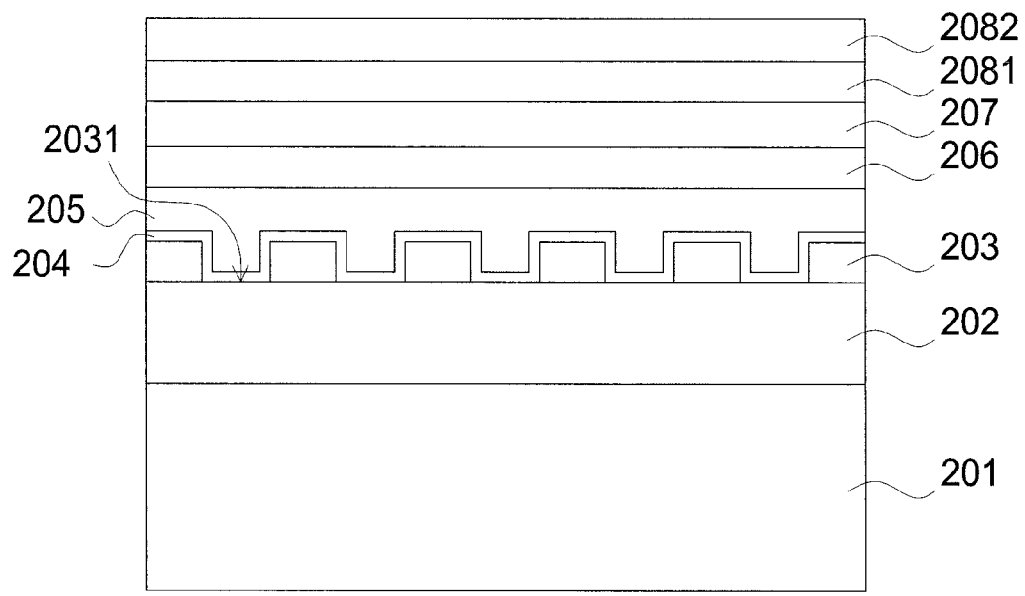
Figure 2G:
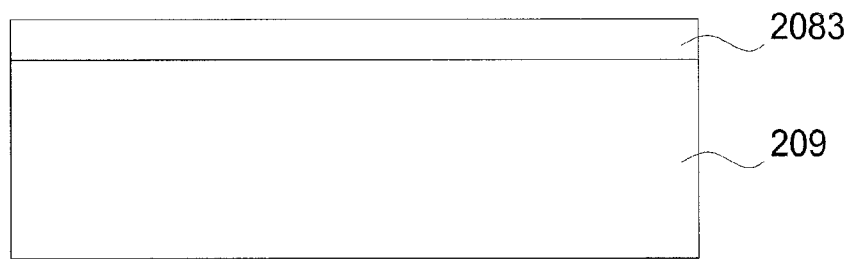
Figure 2H:
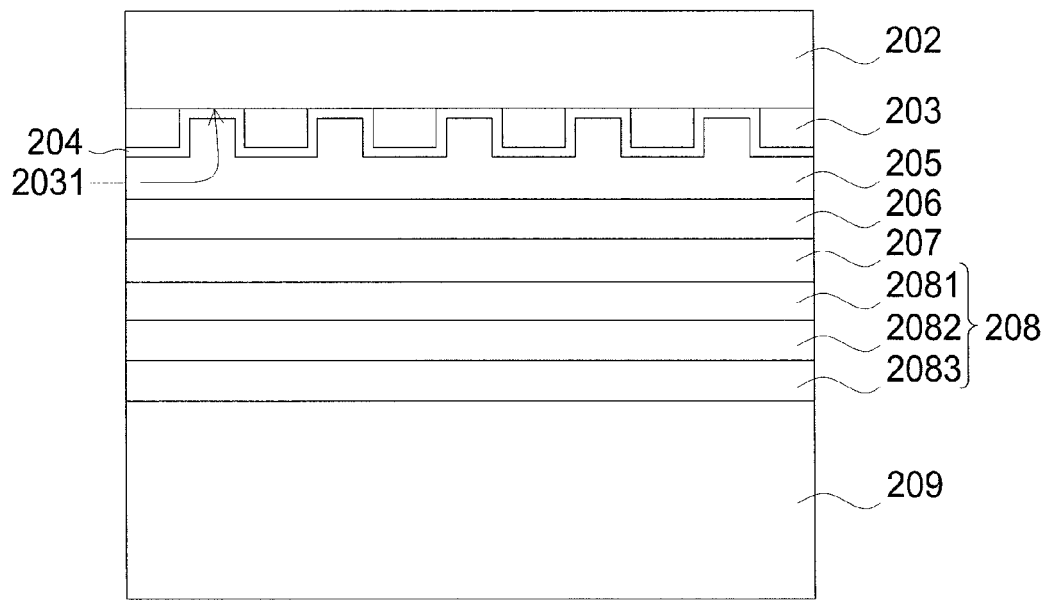
Figure 3A:
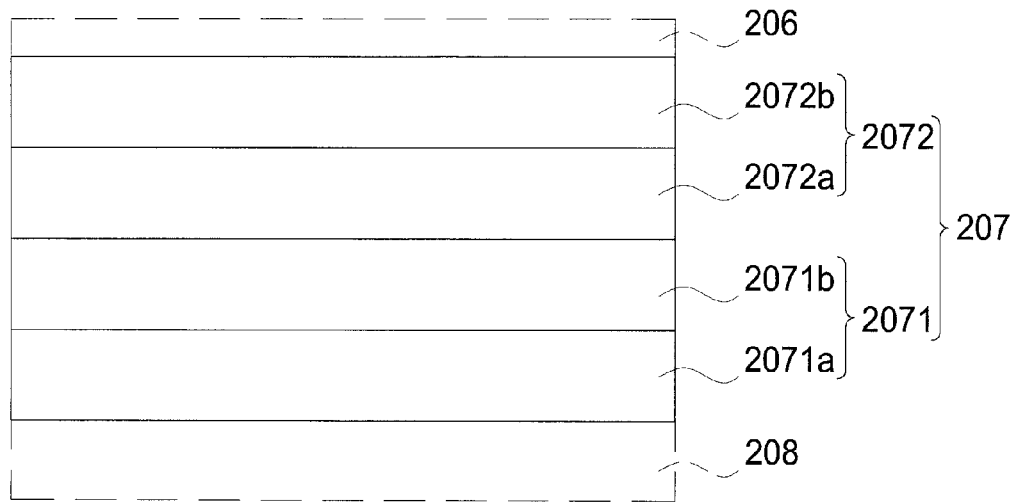
FIGS. 3A and 3B show the barrier layers in the first embodiment.
Figure 3B:
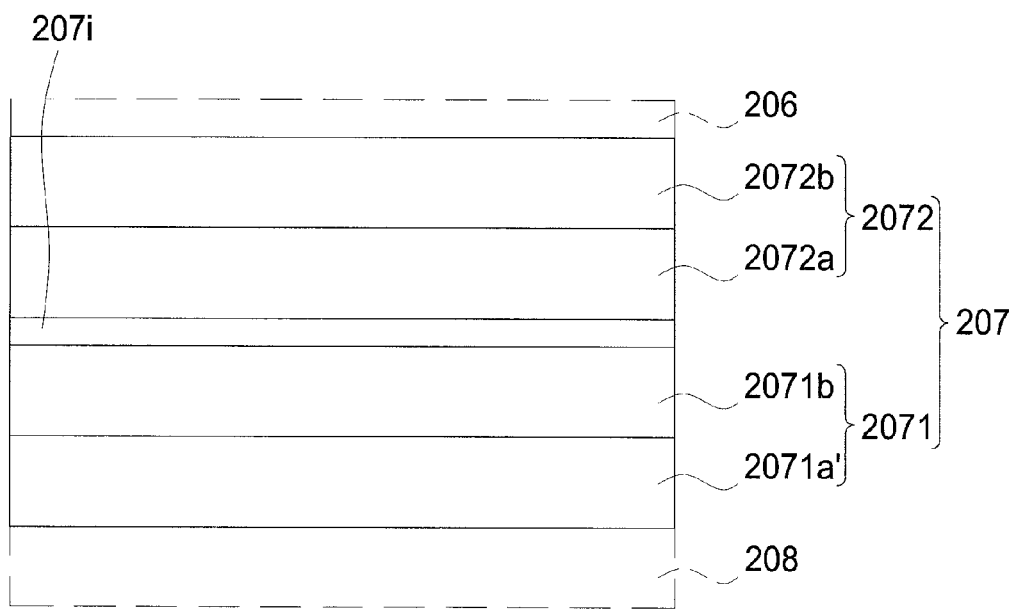

Next, as shown in FIG. 2F, the method further comprises forming a barrier layer 207 on the metal reflective layer 206. The barrier layer 207 is for preventing metal diffusion between the metal reflective layer 206 and the metal connecting structure 208. The metal connecting structure 208 will be illustrated later. The embodiment of the barrier layer 207 is shown in FIG. 3A or FIG. 3B, and will be described in detail later. Next, a first bonding layer 2081 is formed on the barrier layer 207, and a second bonding layer 2082 is formed on the first bonding layer 2081. Next, as shown in FIG. 2G, a permanent substrate 209 is provided, and a third bonding layer 2083 is formed on the permanent substrate 209. As shown in FIG. 2H, the third bonding layer 2083 and the second bonding layer 2082 are bonded together, and the growth substrate 201 is removed after bonding. The first bonding layer 2081, the second bonding layer 2082, and the third bonding layer 2083 form the metal connecting structure 208. The metal connecting structure 208 comprises a low-temperature fusion material with a melting point lower than or equal to 300° C. For example, the low-temperature fusion material comprises indium (In) or tin (Sn). In the present embodiment, the low-temperature fusion material comprises indium (In). For example, when the first bonding layer 2081 comprises gold (Au), the second bonding layer 2082 comprises indium (In), and the third bonding layer 2083 comprises gold (Au), the first bonding layer 2081, the second bonding layer 2082, and the third bonding layer 2083 may form an alloy and be bonded together to form the metal connecting structure 208 at a low temperature, such as a temperature lower than or equal to 300° C., because of the eutectic effect. The metal connecting structure 208 comprises an alloy of indium (In) and gold (Au). In another embodiment, the second bonding layer 2082 is formed on the first bonding layer 2081, and is bonded to the third metal bonding layer 2083 on the permanent substrate 209 to form the metal connecting structure 208.

Figure 2I:
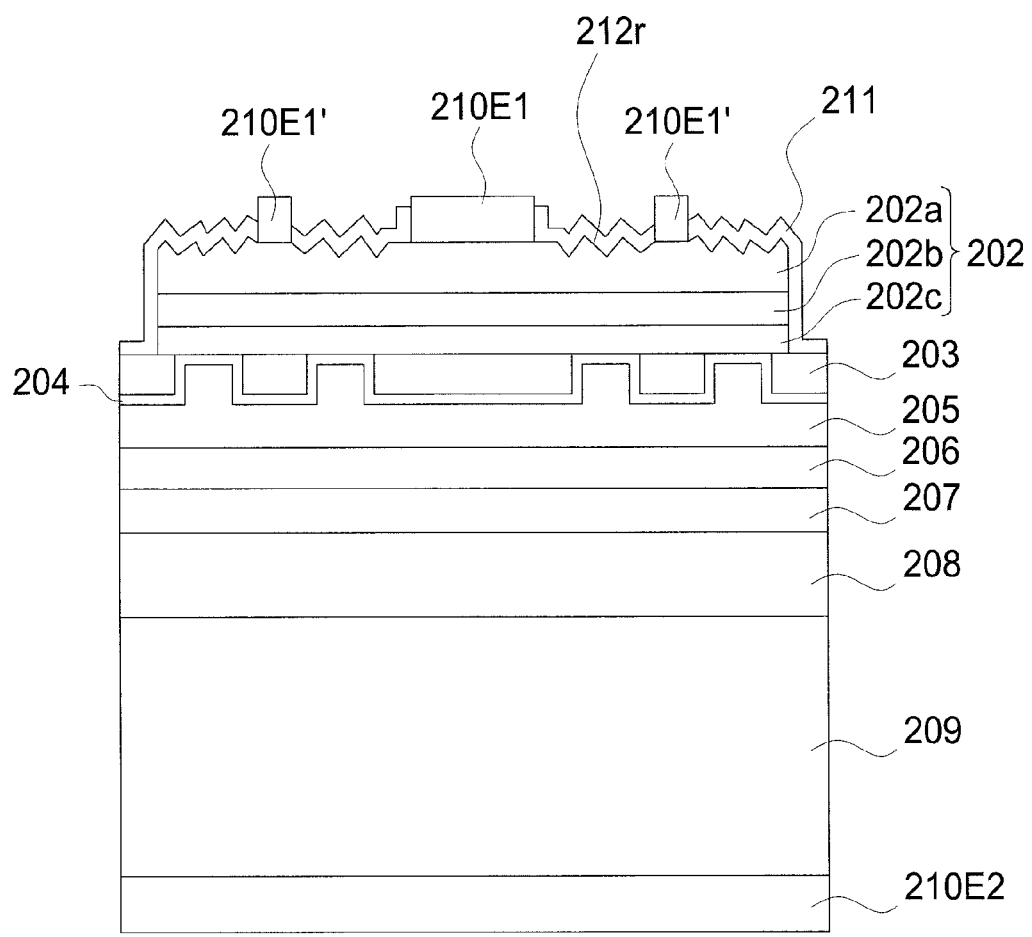

Then, as shown in FIG. 2I, the method further comprises forming a first electrode 210E1 and its extending electrode 210E1' on the light-emitting stack 202. Then, a peripheral part of the light-emitting stack 202 is removed to expose a part of the dielectric layer 203 by lithography and etching processes. A roughening process may be performed optionally on the surface of the light-emitting stack 202 to form a roughened structure 212r on the first conductive type semiconductor layer 202a. A protective layer 211 is then formed on the light-emitting stack 202 and on the exposed part of the dielectric layer 203, wherein the protective layer 211 does not cover the first electrode 210E1 and its extending electrode 210E1'. Finally, a second electrode 210E2 is formed on the permanent substrate 209.

FIG. 3A is used for illustrating the barrier layer 207 in the above embodiment. FIG. 3A illustrates the barrier layer 207 in FIG. 2I, so FIG. 3A is a reference to FIG. 2I at the same time. As mentioned previously, the barrier layer 207 is disposed between the metal reflective layer 206 and the metal connecting structure 208 to prevent the metal diffusion between them. The barrier layer 207 in the present embodiment comprises a first metal multilayer 2071 on the metal connecting structure 208 and a second metal multilayer 2072 on the first metal multilayer 2071. The first metal multilayer 2071 comprises a first metal layer 2071a comprising a first metal material and a second metal layer 2071b comprising a second metal material. The first metal layer 2071a is closer to the metal connecting structure 208 than the second metal layer 2071b is. The second metal multilayer 2072 comprises a third metal layer 2072a comprising a third metal material and a fourth metal layer 2072b comprising a fourth metal material. The third metal layer 2072a is closer to the metal connecting structure 208 than the fourth metal layer 2071b is. Regarding the selection of the materials, the first metal material is different from the second metal material, the third metal material is different from the fourth metal material, and the selection of these metal materials leads to the barrier layer 207 comprises metal elements which are different from a metal element in the metal reflective layer 206. In the present embodiment, the first metal layer 2071a and the third metal layer 2072a comprise platinum (Pt), and the second metal layer 2071b and the fourth metal layer 2072b comprise titanium (Ti). The platinum (Pt) in the first metal layer 2071a and the third metal layer 2072a is mainly a material to prevent metal diffusion between the metal reflective layer 206 and the metal connecting structure 208. The titanium (Ti) in the second metal layer 2071b and the fourth metal layer 2072b is to increase adhesion force. In particular, the titanium (Ti) in the fourth metal layer 2072b which connects with the metal reflective layer 206 provides a good adhesion between the barrier layer 207 and the metal reflective layer 206. That is, a good material selection or arrangement for these metal materials leads to a result that the adhesion between the fourth metal layer 2072b and the metal reflective layer 206 is stronger than the adhesion between the third metal layer 2072a and the metal reflective layer 206. Thus the adhesion between the third metal layer 2072a and the metal reflective layer 206 is reinforced. Regarding the thicknesses of the layers, the thicknesses of the first metal layer 2071a and the third metal layer 2072a are from about 100 Å to 500 Å and the thicknesses of the second metal layer 2071b and the fourth metal layer 2072b are from about 200 Å to 800 Å. In the present embodiment, the thicknesses of the first metal layer 2071a and the third metal layer 2072a are from about 200 Å to 800 Å and the thicknesses of the second metal layer 2071b and the fourth metal layer 2072b are from about 100 Å to 500 Å. The above ranges of the thicknesses makes the first metal multilayer 2071 and the second metal multilayer 2072 be able to prevent metal diffusion between the metal reflective layer 206 and the metal connecting structure 208 and a stress problem is not occurred because of thick thicknesses. The stress problem may have an impact on the following bonding process of the bonding layers of the metal connecting structure 208.

According to the final structure in FIG. 2I with reference to FIG. 3A, the light-emitting device in the first embodiment of the present application comprises the metal connecting structure 208; the barrier layer 207 on the metal connecting structure 208, wherein the barrier layer 207 comprises the first metal multilayer 2071 on the metal connecting structure 208 and the second metal multilayer 2072 on the first metal multilayer 2071; the metal reflective layer 206 on the barrier layer 207; and the light-emitting stack 202 electrically coupled to the metal reflective layer 206. The first metal multilayer 2071 comprises the first metal layer 2071a comprising the first metal material like platinum (Pt) and the second metal layer 2071b comprising the second metal material like titanium (Ti), and the first metal layer 2071a is closer to the metal connecting structure 208 than the second metal layer 2071b. The second metal multilayer 2072 comprises the third metal layer 2072a comprising a third metal material like platinum (Pt) and the fourth metal layer 2072b comprising a fourth metal material like titanium (Ti), and the third metal layer 2072a is closer to the second metal layer 2071b than the fourth metal layer 2072b. Furthermore, as mentioned above, the metal connecting structure 208 comprises an alloy of indium (In) and gold (Au), and the metal reflective layer 206 comprises gold (Au) in the present embodiment. That is, the metal connecting structure 208 and the metal reflective layer 206 comprise the same metal element gold (Au). As mentioned in the background, because the same metal element exists on both sides of the barrier layer 207, other elements (e.g. indium (In) in the present embodiment) in the alloy of the metal connecting structure 208 are particularly easy to be combined on both sides of the barrier layer 207. Therefore, if a thin barrier layer is used, it is unable to effectively prevent metal diffusion of indium (In) between the metal reflective layer 206 and the metal connecting structure 208. An element analysis by EDS line scan is done for a structure shown in FIG. 2I with the barrier layer 207 changed to a thin barrier layer, for example, a single layer of platinum (Pt) with a thickness of 500 Å. The analysis result shows that indium (In) content in the metal reflective layer 206 and indium (In) content in the metal connecting structure 208 are close, wherein both are from about 5 to 10 A.U. (Arbitrary Unit), with an average value of about 7.5 A.U. This result proves that using the thin barrier layer is unable to effectively prevent metal diffusion of indium (In) between the metal reflective layer 206 and the metal connecting structure 208. In contrast, when the aforementioned structure in FIG. 3A is used as the barrier layer 207, because the barrier layer 207 in FIG. 3A comprises a plurality of multilayer structures comprising the first metal multilayer 2071 and the second metal multilayer 2072, and the barrier layer 207 comprises metal elements different from a metal element in the metal reflective layer 206. The barrier layer 207 is able to effectively prevent metal diffusion of indium (In) between the metal reflective layer 206 and the metal connecting structure 208. In addition, compared with the method which tries to raise the barrier layer's ability to prevent metal diffusion by simply increasing the thickness, the barrier layer 207 in FIG. 3A avoids stress problems arisen from increasing the thickness of the barrier layer. Therefore, when an element analysis is done for the structure by EDS line scan, the analysis result shows that indium (In) content in the metal reflective layer 206 significantly decreases and is different from indium (In) content in the metal connecting structure 208. The indium (In) content in the metal reflective layer 206 is substantially the same as indium (In) content in the light-emitting stack 202, and both are less than about 5 A.U. (Arbitrary Unit), with an average value of about only 2 A.U. That is, indium (In) content in the metal reflective layer 206 (an average value of about 2 A.U.) is less than a half of indium (In) content in the metal connecting structure 208 (an average value of about 7.5 A.U.). This result proves that using the barrier layer in the present embodiment is able to effectively prevent metal diffusion of indium (In) between the metal reflective layer 206 and the metal connecting structure 208.

It is noted that the illustration for the barrier layer 207 in FIG. 3A is based on FIG. 2I, i.e., the final structure of the light-emitting device. However, as mentioned previously, the structure in FIG. 2I is formed by making the growth substrate 201 upside down to bond with the permanent substrate 209. Therefore, in regard to the forming method, taking an intermediate process figure like FIG. 2F as an example, the fourth metal layer 2072b, the third metal layer 2072a, the second metal layer 2071b, and the first metal layer 2071a are sequentially formed on the metal reflective layer 206.

FIG. 3B shows another embodiment of the barrier layer of the present application. FIG. 3B is a modification of FIG. 3A, and FIG. 3B also illustrates the barrier layer 207 in FIG. 2I. Therefore, FIG. 3B is a reference to FIG. 2I at the same time. Similarly, the barrier layer 207 is disposed between the metal reflective layer 206 and the metal connecting structure 208 to prevent metal diffusion between them. The barrier layer 207 in the present embodiment is substantially the same as the barrier layer 207 in FIG. 3A, but the material of the first metal layer 2071a' in the present embodiment comprises nickel (Ni), and an anti-oxidation layer 207i is added between the first metal multilayer 2071 and the second metal multilayer 2072 to prevent the oxidation of the second metal multilayer 2072 in the process, wherein the anti-oxidation layer 207i comprises gold (Au), with a thickness of about 3000 Å to 7000 Å. Other details like the material or thickness are as those illustrated previously in FIG. 3A, and are not described again here. Similarly, in regard to the forming method, taking an intermediate process figure like FIG. 2F as an example, the fourth metal layer 2072b, the third metal layer 2072a, the anti-oxidation layer 207i, the second metal layer 2071b, and the first metal layer 2071a are sequentially formed on the metal reflective layer 206. The anti-oxidation layer 207i can prevent the oxidation of the second metal multilayer 2072 in the process, when the second metal multilayer 2072 and the first metal multilayer 2071 are not formed continuously in the same equipment.

The above-mentioned embodiments are only examples to illustrate the theory of the present invention and its effect, rather than be used to limit the present application. Other alternatives and modifications may be made by a person of ordinary skill in the art of the present application without departing from the spirit and scope of the application, and are within the scope of the present application.

What is claimed is:

1. A light-emitting device comprising:
   a substrate;
   a metal connecting structure on the substrate;
   a barrier layer on the metal connecting structure, and the barrier layer comprising a first metal multilayer on the metal connecting structure and a second metal multilayer on the first metal multilayer;
   a metal reflective layer on the barrier layer; and
   a light-emitting stack on the metal reflective layer and the barrier layer located between the substrate and the light-emitting stack,
   wherein the first metal multilayer comprises a first metal layer consisting of a first metal element and a second metal layer consisting of a second metal element, and the first metal layer is closer to the metal connecting structure than the second metal layer is,
   wherein the second metal multilayer comprises a third metal layer comprising a third metal element and a fourth metal layer comprising a fourth metal element, and the third metal layer is closer to the second metal layer than the fourth metal layer is,
   wherein the first metal element is different from the second metal element, and the third metal element is different from the fourth metal element, and
   wherein the first metal element and the third metal element are the same element, or the second metal element and the fourth metal element are the same element.

2. The light-emitting device of claim 1, wherein the third metal layer consists of the third metal element, and the fourth metal layer consists of the fourth metal element.

3. The light-emitting device of claim 1, wherein the first metal element and the third metal element are the same element, and the second metal element and the fourth metal element are the same element.

4. The light-emitting device of claim 1, wherein the first metal element and the third metal element comprise nickel (Ni) or platinum (Pt), and the second metal element and the fourth metal element comprise titanium (Ti).

5. The light-emitting device of claim 1, wherein the metal connecting structure and the metal reflective layer comprise the same metal element.

6. The light-emitting device of claim 5, wherein the same metal element in the metal connecting structure and the metal reflective layer is different from the first metal element, the second metal element, the third metal element, and the fourth metal element.

7. The light-emitting device of claim 5, wherein the metal connecting structure comprises an alloy of indium (In) and gold (Au), and the same metal element in the metal connecting structure and the metal reflective layer is gold.

8. The light-emitting device of claim 1, wherein the metal connecting structure comprises a low-temperature fusion material having a melting point lower than or equal to 300° C.

9. The light-emitting device of claim 8, wherein the low-temperature fusion material comprises indium (In).

10. The light-emitting device of claim 1, wherein the thicknesses of the first metal layer and the third metal layer are from about 200 Å to 800 Å.

11. The light-emitting device of claim 1, wherein the thicknesses of the second metal layer and the fourth metal layer are from about 100 Å to 500 Å.

12. The light-emitting device of claim 1, further comprising a dielectric layer between the metal reflective layer and the light-emitting stack, wherein the dielectric layer has a refractive index less than the refractive index of the light-emitting stack.

13. The light-emitting device of claim 12, wherein the dielectric layer comprises a plurality of through holes which penetrate the dielectric layer.

14. The light-emitting device of claim 13, further comprising a first transparent conductive oxide layer between the metal reflective layer and the dielectric layer, and the first transparent conductive oxide layer filling into the through holes.

15. The light-emitting device of claim 14, further comprising a second transparent conductive oxide layer between the metal reflective layer and the first transparent conductive oxide layer, and the second transparent conductive oxide layer comprising a material different from that of the first transparent conductive oxide layer.

16. A light-emitting device comprising:
   a substrate;
   a metal connecting structure on the substrate;
   a barrier layer on the metal connecting structure, and the barrier layer comprising at least two metal multilayers on the metal connecting structure;
   a metal reflective layer on the barrier layer; and
   a light-emitting stack on the metal reflective layer and the barrier layer located between the substrate and the light-emitting stack, wherein each of the metal multilayer comprises a first metal layer consisting of a first metal element and a second metal layer consisting of a second metal element, wherein the first metal layer is closer to the metal connecting structure than the second metal layer is, and the first metal element is different from the second metal element.

17. The light-emitting device of claim 16, wherein the first metal element comprises nickel (Ni) or platinum (Pt), and the second metal element comprises titanium (Ti).

18. The light-emitting device of claim 16, wherein the thicknesses of the first metal layer is from about 200 Å to 800 Å, and the thicknesses of the second metal layer is from about 100 Å to 500 Å.

19. A light-emitting device comprising:
a metal connecting structure;
a barrier layer on the metal connecting structure, and the barrier layer comprising a first metal multilayer on the metal connecting structure and a second metal multilayer on the first metal multilayer;
an anti-oxidation layer between the first metal multilayer and the second metal multilayer;
a metal reflective layer on the barrier layer; and
a light-emitting stack on the metal reflective layer,
wherein the first metal multilayer comprises a first metal layer comprising a first metal element and a second metal layer comprising a second metal element, and the first metal layer is closer to the metal connecting structure than the second metal layer is,
wherein the second metal multilayer comprises a third metal layer comprising a third metal element and a fourth metal layer comprising a fourth metal element, and the third metal layer is closer to the second metal layer than the fourth metal layer is,
wherein the first metal element is different from the second metal element, and the third metal element is different from the fourth metal element, and
wherein the first metal element and the third metal element are the same element, or the second metal element and the fourth metal element are the same element.

20. The light-emitting device of claim 19, wherein the anti-oxidation layer comprises gold (Au).

* * * * *